(12) United States Patent  
Solt et al.

(10) Patent No.: US 7,984,358 B1
(45) Date of Patent: *Jul. 19, 2011

(54) ERROR-CORRECTION MEMORY ARCHITECTURE FOR TESTING PRODUCTION ERRORS

(75) Inventors: Yosef Solt, Misgav (IL); Eitan Joshua, Moshav Ofer (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 147 days.

This patent is subject to a terminal disclaimer.

(21) Appl. No.: 12/352,113

(22) Filed: Jan. 12, 2009

Related U.S. Application Data

(63) Continuation of application No. 11/787,757, filed on Apr. 17, 2007, now Pat. No. 7,478,308, which is a continuation of application No. 11/280,892, filed on Nov. 17, 2005, now Pat. No. 7,206,988, which is a continuation of application No. 10/752,174, filed on Jan. 6, 2004, now Pat. No. 6,988,237.

(51) Int. Cl.
*G11C 29/00* (2006.01)

(52) U.S. Cl. ............................................ 714/763
(58) Field of Classification Search ............ 714/763, 714/764

See application file for complete search history.

(56) References Cited

U.S. PATENT DOCUMENTS

| | | | |
|---|---|---|---|
| 4,163,147 A * | 7/1979 | Scheuneman et al. | 714/753 |
| 4,205,301 A | 5/1980 | Hisazawa | |
| 4,901,360 A | 2/1990 | Shu et al. | |
| 4,903,268 A | 2/1990 | Hidaka et al. | |
| 5,056,095 A | 10/1991 | Horiguchi et al. | |
| 5,127,014 A | 6/1992 | Raynham | |
| 5,475,825 A | 12/1995 | Yonezawa et al. | |
| 5,485,595 A | 1/1996 | Assar et al. | |
| 5,491,703 A | 2/1996 | Barnaby et al. | |
| 5,513,135 A | 4/1996 | Dell et al. | |
| 5,535,226 A | 7/1996 | Drake et al. | |
| 5,629,898 A | 5/1997 | Idei et al. | |
| 5,636,354 A | 6/1997 | Lear | |
| 5,642,230 A | 6/1997 | Jang | |
| 5,758,056 A | 5/1998 | Barr | |
| 5,796,758 A | 8/1998 | Levitan | |
| 5,848,076 A | 12/1998 | Yoshimura | |
| 5,890,201 A | 3/1999 | McLellan et al. | |
| 5,958,068 A | 9/1999 | Arimilli et al. | |

(Continued)

OTHER PUBLICATIONS

IBM Tech Disc. Bulletin NN85112562, "System for Efficiently Using Spare Memory Components for Defect Corrections Employing Content-Addressable Memory" Date: Nov. 1, 1985.

(Continued)

*Primary Examiner* — James C Kerveros

(57) ABSTRACT

A system includes a first circuit generating error-correction (EC) bits based on test data. Memory comprises a plurality of memory lines each including a data portion storing the test data and an error-correction (EC) portion storing corresponding ones of the EC bits. An input receives the test data. A switching device selectively outputs one of the test data from the input and the EC bits and the test data from the first circuit to the memory. The test data comprise T pairs of test vectors. A first test vector of each of the T pairs of test vectors is an inverse of a second test vector of each of the T pairs of test vectors. Each of the first test vectors in the T pairs of test vectors is unique and each of the second test vectors in the T pairs of test vectors is unique. T is an integer greater than one.

20 Claims, 5 Drawing Sheets

U.S. PATENT DOCUMENTS

| | | | |
|---|---|---|---|
| 5,958,079 | A | 9/1999 | Yoshimura |
| 5,959,914 | A | 9/1999 | Gates et al. |
| 5,973,949 | A | 10/1999 | Kramer et al. |
| 5,996,107 | A | 11/1999 | Tomisawa |
| 6,000,006 | A | 12/1999 | Bruce et al. |
| 6,041,422 | A | 3/2000 | Deas |
| 6,058,047 | A | 5/2000 | Kikuchi |
| 6,065,141 | A | 5/2000 | Kitagawa |
| 6,067,656 | A | 5/2000 | Rusu et al. |
| 6,085,334 | A | 7/2000 | Giles et al. |
| 6,122,763 | A | 9/2000 | Pyndiah et al. |
| 6,134,631 | A | 10/2000 | Jennings |
| 6,175,941 | B1 | 1/2001 | Poeppelman et al. |
| 6,233,646 | B1 | 5/2001 | Hahm |
| 6,237,116 | B1 | 5/2001 | Fazel et al. |
| 6,275,406 | B1 | 8/2001 | Gibson et al. |
| 6,295,617 | B1 | 9/2001 | Sonobe |
| 6,331,961 | B1 | 12/2001 | Kengeri et al. |
| 6,385,071 | B1 | 5/2002 | Chai et al. |
| 6,414,876 | B1 | 7/2002 | Harari et al. |
| 6,438,726 | B1 | 8/2002 | Walters, Jr. |
| 6,457,154 | B1 | 9/2002 | Chen et al. |
| 6,484,271 | B1 | 11/2002 | Gray |
| 6,563,754 | B1 | 5/2003 | Lien et al. |
| 6,597,595 | B1 | 7/2003 | Ichiriu et al. |
| 6,700,827 | B2 | 3/2004 | Lien et al. |
| 6,751,755 | B1 | 6/2004 | Sywyk et al. |
| 6,778,457 | B1 | 8/2004 | Burgan |
| 6,799,246 | B1 | 9/2004 | Wise |
| 6,898,140 | B2 | 5/2005 | Leung et al. |
| 6,938,193 | B1 | 8/2005 | Honda |
| 6,988,237 | B1 | 1/2006 | Solt et al. |
| 7,017,089 | B1 | 3/2006 | Huse |
| 7,051,151 | B2 | 5/2006 | Perego et al. |
| 7,062,597 | B2 | 6/2006 | Perego et al. |
| 7,065,622 | B2 | 6/2006 | Donnelly et al. |
| 7,073,099 | B1 | 7/2006 | Sutardja et al. |
| 7,206,988 | B1 | 4/2007 | Solt et al. |
| 7,216,284 | B2 | 5/2007 | Hsu et al. |
| 7,308,530 | B1 | 12/2007 | Armstrong et al. |
| 7,809,998 | B1 | 10/2010 | Sutardja et al. |
| 7,814,382 | B2 | 10/2010 | Sutardja et al. |
| 7,818,636 | B1 | 10/2010 | Sutardja et al. |
| 7,818,639 | B2 | 10/2010 | Sutardja et al. |
| 7,823,030 | B2 | 10/2010 | Sutardja et al. |
| 2001/0032296 | A1 | 10/2001 | Nishimukai et al. |
| 2001/0048625 | A1 | 12/2001 | Patti et al. |
| 2002/0004873 | A1 | 1/2002 | Kawaguchi |
| 2004/0218439 | A1 | 11/2004 | Harrand et al. |
| 2004/0243886 | A1 | 12/2004 | Klein |
| 2006/0158950 | A1 | 7/2006 | Klein |
| 2008/0307301 | A1 | 12/2008 | Decker et al. |

OTHER PUBLICATIONS

Schober et al., "Memory Built-in Self-repair Using Redundant Words" International Test Conference Proceedings, Publication Date: Oct. 30 to Nov. 1, 2001; pp. 995-1001, Inspec Accession No. 7211400.

Bigger, Better, Faster . . . Improve server performance with Crucial fully buffered DIMMs; Andy Heidelberg of Crucial Technology; 6 pages.

"FBDIMM—Unleashing Server Memory Capacity"; Micron Technology, Inc.; 2006; 2 pages.

"Fault-tolerant content addressable memory" by Lo, J.-C. This paper appears in: Computer Design: VLSI in Computers and Processors, 1993. ICCD '93. Proceedings., 1993 IEEE International Conference on Publication Date: Oct. 3-6, 1993 on pp. 193-196 ISBN: 08186-4230-0 INSPEC Accession Number: 4955866.

"Fully-parallel multi-megabit integrated CAM/RAM design" by Schultz et al. This paper appears in: Memory Technology, Design and Testing, 1994., Records of the IEE International Workshop on Publication Date: Aug. 8-9, 1994 On pp. 46-51 ISBN: 08186-6245-X INSPEC Accession Number: 4933182.

"Functional testing of content-addressable memories" by Lin et al. This paper appears in: Memory Technology, Design and Testing, 1998. Proceedings. International Workshop on Publication Date: Aug. 24-25, 1998 On page(s): 70-75 ISBN: 0/8186-8494-1 INSPEC Accession Number: 6142197.

"Testing and Diagnosing embedded content addressable memories" by Li et al. This paper appears in: VLSI Test Symposium, 2002. Proceedings 20th IEEE Publication Date: Apr. 28-May 2, 2002 On pp. 389-394 ISBN: 0/7695-1570-3 INSPEC Accession Number: 7361019.

Delgado-Frias, Jose G. et al. "A VLSI Interconnection Network Router Using a D-CAM with Hidden Refresh." (Sixth Great Lakes Symposium on Mar. 22-23,1996): pp. 246-251.

McAuley et al. "A Self-Testing Reconfigurable CAM." Solid-State Circuits, IEEE Journal vol. 26. Issue 3 (Mar. 1991): 257-261.

Noghani et al. "Design Rule Centering for Row Redundant Content Addressable Memories." Defect and Fault Tolerance in VLSI Systems, Proceedings., 1992 IEEE International Workshop (Nov. 4-6, 1992): pp. 217-226.

Notification of Transmittal of The International Search Report and The Written Opinion of the International Searching Authority, or The Declaration dated May 27, 2008 in reference to PCT/US2007/016661 (21 pgs).

Youngs et al. "Mapping and Repairing Embedded-Memory Defects." Design & Test Computers, IEEE vol. 14. Issue 1 (Jan.-Mar. 1997): pp. 18-24.

\* cited by examiner

ERROR-CORRECTION MEMORY ARCHITECTURE FOR TESTING PRODUCTION ERRORS

CROSS-REFERENCE TO RELATED APPLICATION

This application is a continuation of U.S. Ser. No. 11/787,757, filed Apr. 17, 2007, now U.S. Pat. No. 7,478,308, which is a continuation of U.S. Ser. No. 11/280,892, filed Nov. 17, 2005, now U.S. Pat. No. 7,206,988, which application is a continuation of U.S. patent application Ser. No. 10/752,174, filed Jan. 6, 2004, now U.S. Pat. No. 6,988,237, which application is related to U.S. Non-Provisional patent application Ser. No. 10/184,334 filed Jun. 26, 2002, now U.S. Pat. No. 7,073,099. The disclosures of the above applications are incorporated herein by reference in their entirety.

BACKGROUND

1. Field of the Invention

The present invention relates generally to testing integrated circuits. More particularly, the present invention relates to testing integrated circuit memory using error-correction code (ECC) bits.

2. Background Information

Memory yield is a major factor in chip yield. Memory consumes half of the total chip area of today's average semiconductor, and this fraction is projected to rise dramatically in coming years. Accordingly, it is highly desirable to increase memory yield.

One conventional approach to increasing memory yield is laser repair. According to this approach, each chip includes extra memory elements such as rows, columns, and banks, which be connected by burning on-chip fuses using laser light to replace any defective memory elements found during memory test.

Another conventional approach is to accept a small number of memory defects, and to correct the data as it is read from the defective memory cells using an error-correction scheme. Conventional error-correction codes (ECC) are used to generate error-correction (EC) bits as data is written to memory. The EC bits are then used to correct the data as it is read from the memory if the number of data errors is equal to, or less than, the power of the code. Some codes can also detect errors when the number of errors is too great to correct. For example, single-error correct, double-error detect (SECDED) codes can be used to correct a one-bit error in a word of data, and to detect a two-bit error in a data word. In this specification, both types of codes are referred to as error-correction (EC) codes. The benefits of such schemes are disclosed in U.S. Non-Provisional patent application Ser. No. 10/184,334 filed Jun. 26, 2002, the disclosure thereof incorporated by reference herein in its entirety.

FIG. 1 shows a test system 100 for a conventional integrated circuit (IC) 102 using an EC code. Test system 100 comprises an IC 102 and a tester 104. IC 102 comprises a memory 106 comprising a plurality of memory lines 120A through 120N. Each memory line 120 comprises a plurality of data cells 122 each adapted to store a bit of data and a plurality of EC cells 124 each adapted to store an EC bit. Thus memory 120 comprises data cells 122A through 122N and EC cells 124A through 124N.

When data is written to memory 106, an EC input circuit 108 generates EC bits based on the data bits using an algorithm such as the Hamming code, writes the data bits to the data cells 122 of a memory line 120 in memory 106, and writes the EC bits to the EC cells 124 of that memory line 120. When data is read from memory 106, an EC output circuit 110 processes the data.

EC output circuit 110 comprises an error correction circuit 116 and an optional error detection circuit 118. Error correction circuit 116 uses the EC bits read from a memory line 120 to correct errors in the data bits read from the memory line 120. Optional error detection circuit 118 indicates whether the data bits contain errors that were detected but not corrected.

ICs such as IC 102 are tested by writing data to the memory 106, reading the data from the memory 106, and comparing the read and written data. While this approach is sufficient to detect most flaws in the data cells 122, it cannot detect any flaws in the EC cells 124.

SUMMARY OF THE INVENTION

In general, in one aspect, the invention features an integrated circuit comprising a memory comprising a plurality of memory lines, each memory line comprising a plurality of data cells each to store a data bit, and a plurality of error-correction (EC) cells each to store an EC bit corresponding to the data bits stored in the data cells of the memory line; an EC input circuit to generate the EC bits based on the corresponding data bits; an EC output circuit comprising an EC correction circuit to correct errors in the bits read from the data cells of each of the memory lines in accordance with the bits read from the EC cells of the memory line; and a switch comprising first inputs to receive the EC bits from the EC input circuit, second inputs to receive test EC bits from EC test nodes of the integrated circuit, and outputs to provide either the EC bits or the EC test bits to the memory in accordance with a test signal.

Particular implementations can include one or more of the following features. The integrated circuit further comprises one or more EC output terminals to output, from the integrated circuit, the bits read from the EC cells of the memory lines. The integrated circuit further comprises one or more EC input terminals to input, to the integrated circuit, the EC test bits. The integrated circuit further comprises an EC error detection circuit to assert an error signal when the number of errors in the bits read from one of the memory lines is greater than, or equal to, a predetermined threshold. The switch comprises a multiplexer. The EC input circuit is further to generate the EC bits using a code selected from the group consisting of error-correction codes; and single-error correct, double-error detect codes. The integrated circuit further comprises a test pattern generation circuit to provide one or more vectors of test data to the memory, wherein the memory stores the vectors of the test data in one of the memory lines; and an EC error detection circuit to assert an error signal when the number of errors in the bits read from one of the memory lines is greater than, or equal to, a predetermined threshold. The integrated circuit comprises a further switch comprising first further inputs to receive the data bits, second further inputs to receive test data bits from data test nodes of the integrated circuit, and further outputs to provide either the data bits or the data test bits to the memory in accordance with the test signal. The integrated circuit comprises one or more test data output terminals to output, from the integrated circuit, the bits read from the data cells of the memory lines. The integrated circuit comprises one or more data input terminals to input, to the integrated circuit, the test data bits. The integrated circuit comprises wherein the EC correction circuit is further to output, from the integrated circuit, the bits read from the data cells of the memory lines in response to the test signal.

In general, in one aspect, the invention features a method for testing an integrated circuit comprising a memory comprising a plurality of memory lines, each memory line comprising a plurality of data cells each adapted to store a data bit and a plurality of error-correction (EC) cells each adapted to store an EC bit generated by an EC input circuit of the integrated circuit based on the data bits stored in the data cells of the memory line, the method comprising generating test EC bits; writing the test EC bits to the EC cells of one of the memory lines of the memory; reading the bits from the EC cells of the one of the memory lines of the memory; and generating a test result based on the test EC bits and the bits read from the EC cells of the one of the memory lines of the memory.

Particular implementations can include one or more of the following features. The method further comprises generating test data bits; writing the test data bits to the data cells of the one of the memory lines of the memory; reading bits from the data cells of the one of the memory lines of the memory; and generating the test result based on the test data bits, the bits read from the data cells of the one of the memory lines of the memory, the test EC bits, and the bits read from the EC cells of the one of the memory lines of the memory. The test EC bits are generated based on the test data bits using a code selected from the group consisting of error-correction codes; and single-error correct, double-error detect codes. The method further comprises providing one or more vectors of test data to the memory, wherein the memory stores the vectors of the test data in one of the memory lines.

The details of one or more implementations are set forth in the accompanying drawings and the description below. Other features will be apparent from the description and drawings, and from the claims.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

Figure 1:
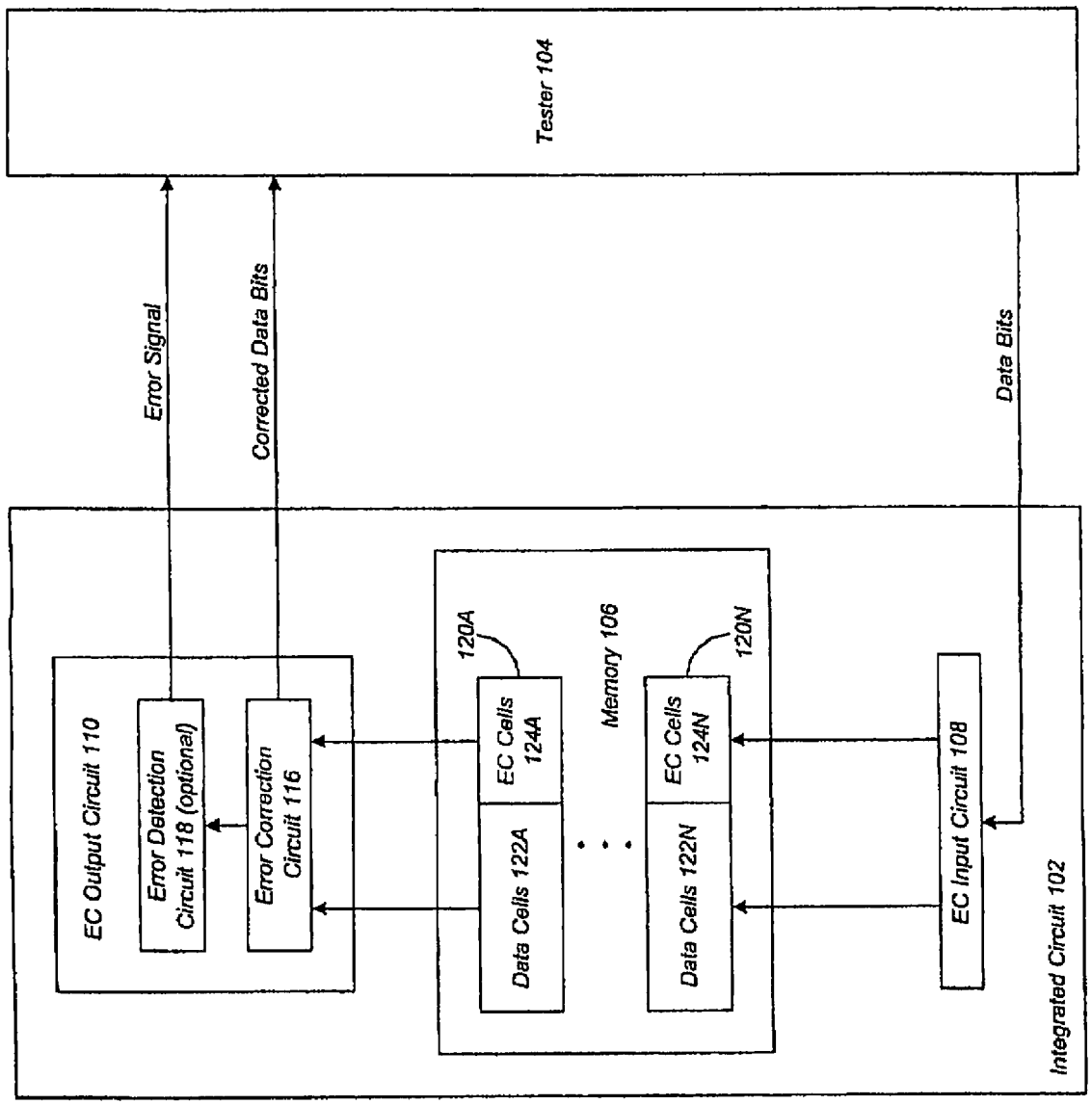
FIG. 1 shows a test system for a conventional integrated circuit using an EC code.

The leading digit(s) of each reference numeral used in this specification indicates the number of the drawing in which the reference numeral first appears.

DETAILED DESCRIPTION OF THE PREFERRED EMBODIMENTS

The inventors have discovered that the architecture of FIG. 1, because it does not permit testing of the EC cells 124 of memory 106, not only prevents detecting flaws in the EC cells 124, but can also hide flaws in data cells 122 unless a prohibitively large number of test patterns is used.

For example, suppose IC 102 of FIG. 1 employs an EC code with a power of one, so that EC output circuit 110 can correct for any memory line that has only a single bit error.

Also suppose that one of the memory lines 120 has two bit errors, such that the two least-significant of the EC cells 124 is stuck at zero. We can represent this as EC[1:0]=00. If the test patterns applied as data bits to IC 102 always cause EC input circuit 108 to produce EC[1:0]=00, then IC 102 will pass despite the stuck bits. And if the test patterns always cause EC input circuit 108 to produce EC[1:0]=01 or EC[1:0]=10, then EC output circuit can correct this single-bit error, and IC 102 will again pass despite the stuck bits. Only a test pattern that causes EC input circuit 108 to produce EC[1:0]=11 will result in a two-bit error that EC output circuit 110 cannot correct, thereby causing IC 102 to fail. Similar arguments apply when one or both of the two stuck bits are located in the data cells 122 of the memory line 120.

Figure 2:
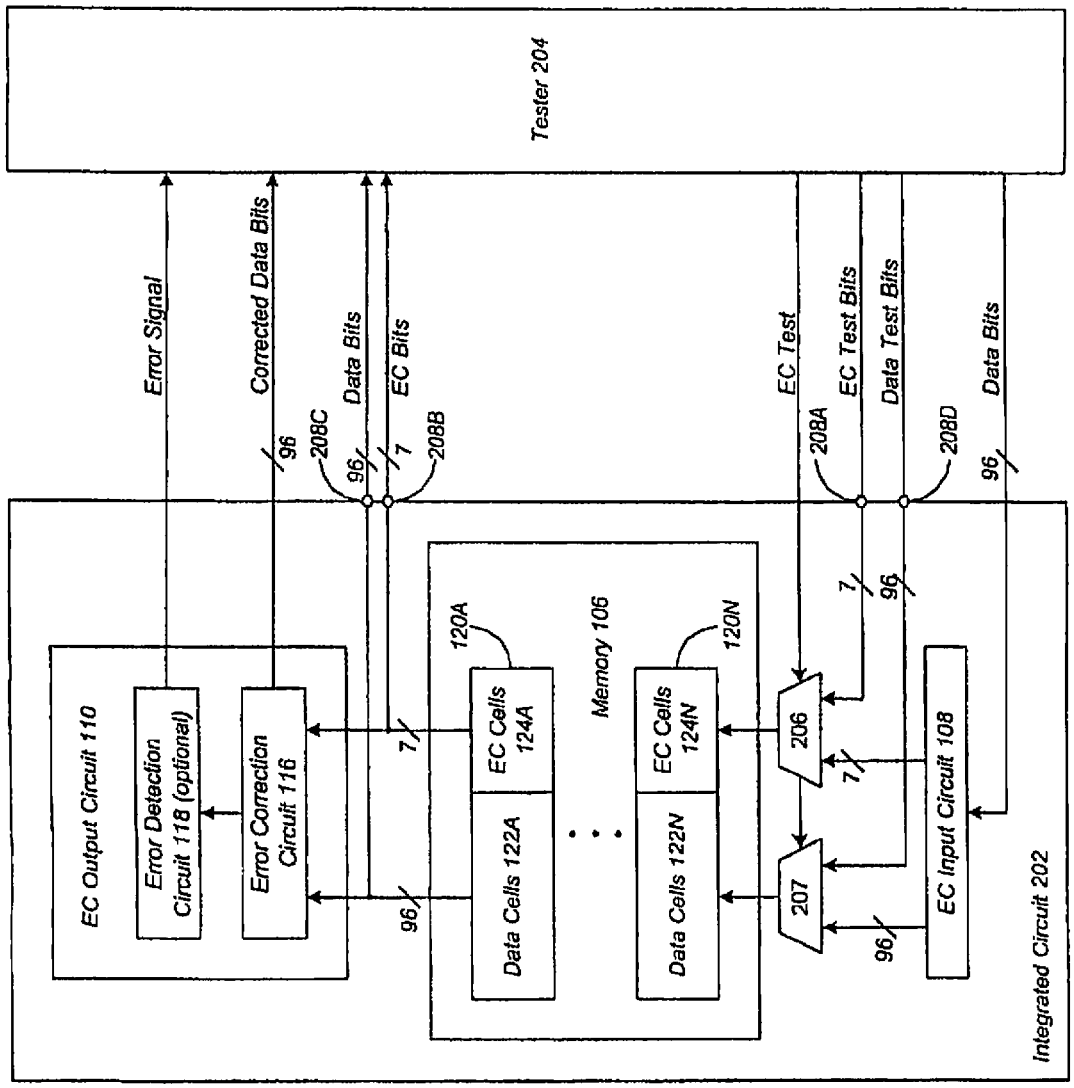
FIG. 2 shows a test system for an integrated circuit according to a preferred embodiment.

FIG. 2 shows a test system 200 for an integrated circuit (IC) 202 according to a preferred embodiment. Test system 200 comprises an IC 202 and a tester 204. IC 202 comprises a memory 106 comprising a plurality of memory lines 120A through 120N. Each memory line 120 comprises a plurality of data cells 122 each adapted to store a bit of data and a plurality of EC cells 124 each adapted to store an EC bit. Thus memory 120 comprises data cells 122A through 122N and EC cells 124A through 124N.

When data is written to memory 106, an EC input circuit 108 generates EC bits based on the data bits using an algorithm such as the Hamming code, writes the data bits to the data cells 122 of a memory line 120 in memory 106, and writes the EC bits to the EC cells 124 of that memory line 120.

EC output circuit 110 comprises an error correction circuit 116 and an optional error detection circuit 118. Error correction circuit 116 uses the EC bits read from a memory line 120 to correct errors in the data bits read from the memory line 120. Optional error detection circuit 118 indicates whether the bits contain errors that were detected but not corrected.

Preferably EC input circuit 108 and EC output circuit 110 employ a single-error correct, double-error detect (SECDED) EC code. For example, the SECDED code produces 7 EC bits for a 96-bit data word. However, other EC codes, such as ECC codes, can be used instead.

IC 202 also comprises a switch such as multiplexer 206 that allows data to be written directly to the EC cells 124 of memory 106 under the control of an EC test signal. Preferably, IC 202 comprises one or more terminals 208A to permit EC test bits to be input into the IC by tester 204 to multiplexer 206. IC 202 also preferably comprises one or more terminals 208B to output the EC bits read from memory 106. This architecture allows tester 204 to directly test the EC cells 124 of memory 106.

In some embodiments, IC 202 also comprises another switch such as multiplexer 207 that allows data to be written directly to the data cells 122 of memory 106 under the control of the EC test signal. Preferably, IC 202 comprises one or more terminals 208D to permit data test bits to be input into the IC by tester 204 to multiplexer 207. IC 202 also preferably comprises one or more terminals 208C to output the data bits read from memory 106. In alternative embodiments, the data bits can be obtained from error correction circuit 116 by disabling error correction circuit 116, for example using the EC test signal. This architecture allows tester 204 to directly test the data cells 122 of memory 106.

Figure 3:
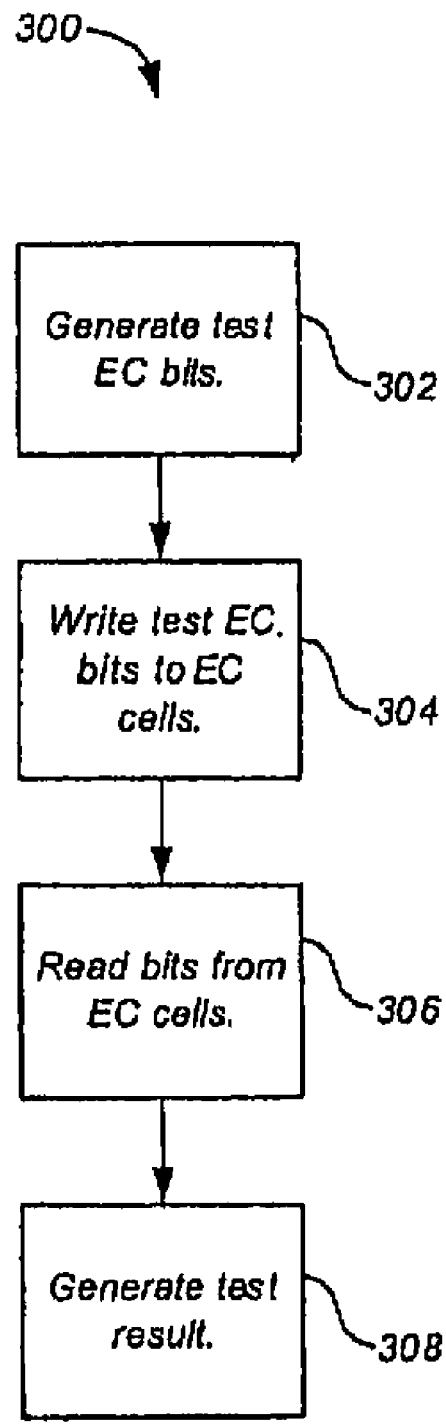
FIG. 3 shows a process for testing the integrated circuit of FIG. 2 according to a preferred embodiment.

FIG. 3 shows a process 300 for testing the IC 202 of FIG. 2 according to a preferred embodiment. Tester 204 generates test EC bits (step 302) and asserts the EC test signal so that multiplexer 206 connects terminals 208A to the EC cells 124 of memory 106. Tester 204 then writes the test EC bits via terminals 208A to the EC cells 124 of one or more of the memory lines 120 of memory 106 (step 304). Tester 204 subsequently reads, via terminals 208B, the bits from the EC cells 124 of the memory line 120 (step 306), and generates a test result based on the test EC bits written to the EC cells 124 of memory line 120 and the bits subsequently read from the EC cells 124 of the memory line 120 (step 308).

Figure 4:
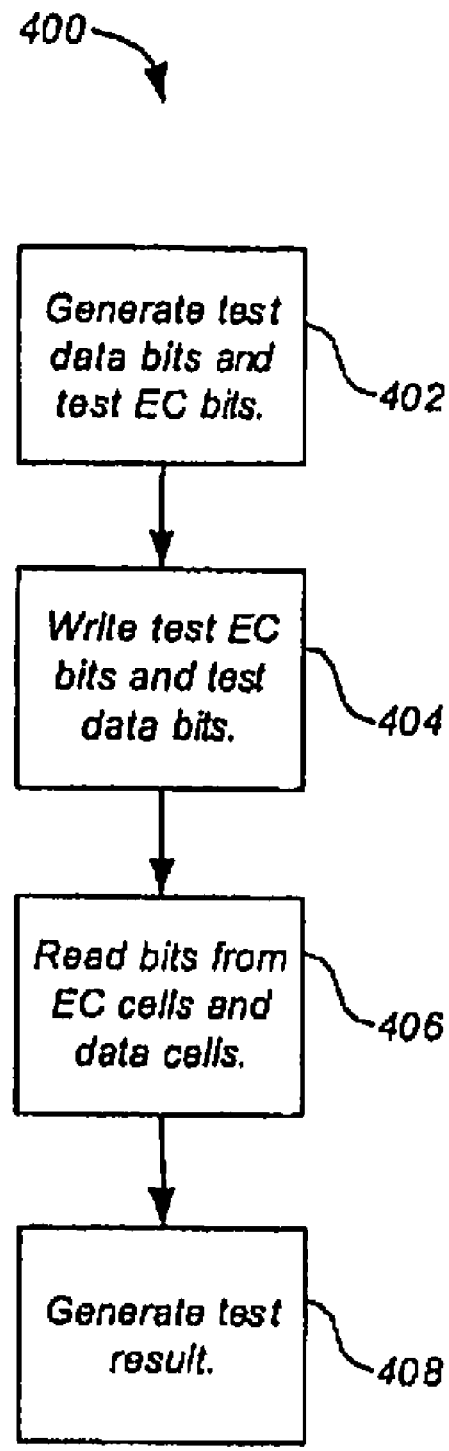
FIG. 4 shows another process for testing the integrated circuit of FIG. 2 according to a preferred embodiment.

Of course, tester 204 can test data cells 122 and EC cells 124 of memory 106 at the same time. FIG. 4 shows a process 400 for testing the IC 202 of FIG. 2 according to a preferred embodiment. Tester 204 generates test data bits and test EC bits (step 402) and asserts the EC test signal so that multiplexer 206 connects terminals 208A to the EC cells 124 of memory 106 and multiplexer 207 connects terminals 208D to the data cells 122 of memory 106. Tester 204 then writes the test EC bits via terminals 208A to the EC cells 124 of one or more of the memory lines 120 of memory 106, and writes the test data bits to the data cells 122 of one or more of the memory lines 120 of memory 106 (step 404). Tester 204 subsequently reads, via terminals 208B, the bits from the EC cells 124 of the memory lines 120, and reads, via terminals 208C, the bits from the data cells 122 of the memory lines 120 (step 406). Tester 204 then generates a test result based on the test data bits, the bits read from the data cells 122 of the memory lines 120, the test EC bits, and the bits read from the EC cells 124 of the memory lines 120 (step 408). For example, for a SECDED memory, the test results would identify any memory line 120 having more than two faulty bits.

Figure 5:
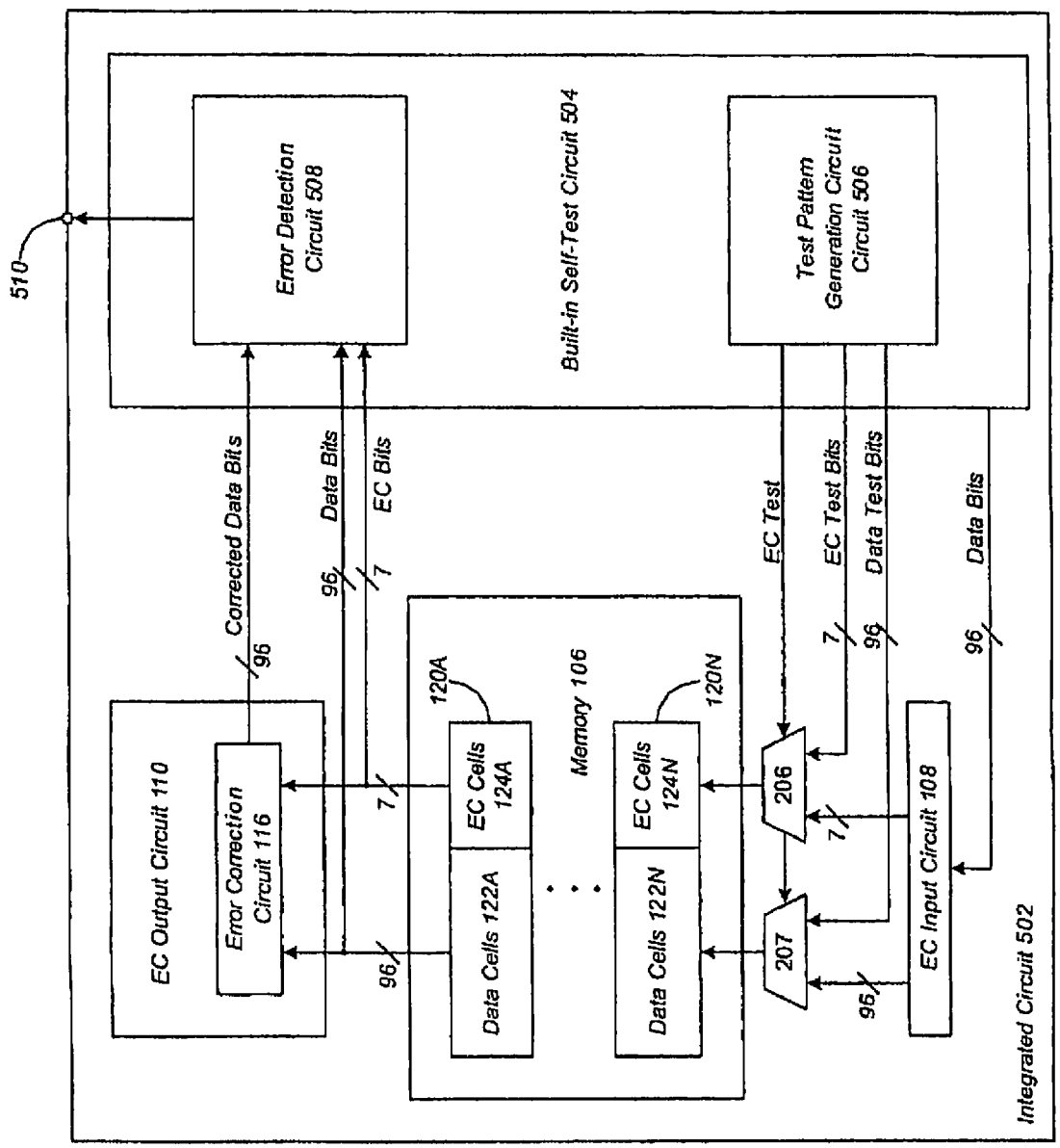
FIG. 5 shows an integrated circuit that includes a built-in self-test circuit according to a preferred embodiment.

FIG. 5 shows an integrated circuit 502 that includes a built-in self-test circuit 504 according to a preferred embodiment. Integrated circuit 502 is similar to integrated circuit 202, except for the addition of built-in self-test circuit 504, which comprises a test pattern generation circuit 506 and an error detection circuit 508. Test pattern generation circuit 506 provides vectors of test data to memory 106, which stores each vector in one of memory lines 120. Error detection circuit 508 reads the corrected data bits and EC bits from memory 106, and asserts an error signal at a terminal 510 when the number of errors in the bits read from one of memory lines 120 is greater than, or equal to, a predetermined threshold.

The test patterns required to test integrated circuit memories according to embodiments of the present invention depend on the test method used. For example, in one embodiment, tester 204 records the defective bits for each line during the test, and generates the test results based on an analysis of the recorded information. For this type of test method, an ordinary solid pattern is sufficient. For example, a pattern comprising a vector of all ones followed by a vector of all zeros will suffice.

However, if each memory line is analyzed individually, for example, as it is read from the memory, a more complex set of patterns is required. One such pattern is described below. This pattern requires log2(bus_size) pairs of vectors, where bus_size is the width of the bus in bits. In the nth vector pair of the test pattern, the bit values alternate every n bits. The vectors in a pair differ by being shifted n bit places relative to each other. For example, the first vector pair comprises 4'b0101 and 4'b1010, the second vector pair comprises 4'b0011 and 4'b1100, and so on. These vectors need not be presented in order, and can be shifted by a number of bits, as long as all of the vectors are shifted by the same number of bits, and in the same direction.

For example, for bus_size=32 the minimal test pattern comprises the following vectors:
Alternate 1 bit:
32'hAAAAAAAA
32'h55555555
Alternate 2 bits:
32'hCCCCCCCC
32'h33333333
Alternate 4 bits:
32'hF0F0F0F0
32'h0F0F0F0F
Alternate 8 bits:
32'hFF00FF00
32'h00FF00FF
Alternate 16 bits:
32'hFFFF0000
32'h0000FFFF
Alternate 32 bits:
32'h00000000
32'hFFFFFFFF As another example, for bus_size=64 the minimal test pattern comprises the following vectors:
Alternate 1 bit:
64'hAAAAAAAAAAAAAAAA
64'h5555555555555555
Alternate 2 bits:
64'hCCCCCCCCCCCCCCCC
64'h3333333333333333
Alternate 4 bits:
64'hF0F0F0F0F0F0F0F0
64'h0F0F0F0F0F0F0F0F
Alternate 8 bits:
64'hFF00FF00FF00FF00
64'h00FF00FF00FF00FF
Alternate 16 bits:
64'hFFFF0000FFFF0000
64h0000FFFF0000FFFF
Alternate 32 bits:
64'hFFFFFFFF00000000
64'h00000000FFFFFFFF
Alternate 64 bits:
64'h0000000000000000
64'hFFFFFFFFFFFFFFFF A number of implementations of the invention have been described. Nevertheless, it will be understood that various modifications may be made without departing from the spirit and scope of the invention. Accordingly, other implementations are within the scope of the following claims.

What is claimed is:

1. A system comprising:
a first circuit configured to generate error-correction (EC) bits based on test data;
memory comprising a plurality of memory lines each including a data portion, the data portion configured to store the test data, and ii) an error-correction (EC) portion, the EC portion configured to store corresponding ones of the EC bits;
an input configured to receive the test data; and
a switching device configured to selectively output one of the test data from the input and the EC bits and the test data from the first circuit to the memory,
wherein the test data comprise T pairs of test vectors, wherein a first test vector of each of the T pairs of test vectors is an inverse of a second test vector of each of the T pairs of test vectors, wherein each of the first test vectors in the T pairs of test vectors is different from others of the first test vectors, and wherein each of the second test vectors in the T pairs of test vectors is different from others of the second test vectors, where T is an integer greater than one.

2. The system of claim 1, wherein the memory includes a bus width equal to $2^{T-1}$, wherein the T pairs of test vectors each include $2^{T-1}$ bits, wherein the first test vector of an $n^{th}$ pair of the T pairs of test vector includes $2^{n-1}$ bits that have a first state and that alternate every n bits, and wherein n is an integer from one to T.

3. The system of claim 2, wherein the second test vector of the $n^{th}$ pair of the T pairs of test vector includes $2^{n-1}$ bits that have a second state and that alternate every n bits.

4. The system of claim 1, further comprising:
an EC output circuit comprising an EC correction circuit, the EC correction circuit configured to correct errors in the test data read from one of the data portions based on the EC bits in the corresponding one of the EC portions.

5. The system of claim 4, wherein the EC output circuit further comprises an EC error detection circuit, the EC error detection circuit configured to generate an error signal when a number of errors detected in the test data read from one of the data portions is greater than or equal to a predetermined threshold.

6. The system of claim 1, wherein the test data comprise test bits and test EC bits.

7. The system of claim 1, wherein the switching device comprises a multiplexer.

8. The system of claim 1, wherein the first circuit is configured to generate the EC bits using a code selected from the group consisting of error-correction codes and single-error correct, double-error detect codes.

9. An integrated circuit comprising the system of claim 1 and further comprising a built-in self-test circuit configured to generate the test data, wherein the switching device is configured to select one of the test data from the input and the EC and test data from the first circuit based on a test signal generated by the built-in self-test circuit.

10. An integrated circuit comprising the system of claim 1 and further comprising a generation circuit configured to output the test data to the input.

11. The system of claim 1, further comprising an EC error detection circuit configured to generate an error signal when a number of errors in the bits read from one of the data portions is greater than or equal to a predetermined threshold.

12. A system, comprising:
a first circuit configured to generate error-correction (EC) bits based on test data;
memory including a bus width equal to $2^{T-1}$, where T is an integer greater than one, and comprising a plurality of memory lines each including i) a data portion configured to store the test data and ii) an error-correction (EC) portion configured to store corresponding ones of the EC bits;
an input configured to receive the test data; and
a switching device configured to selectively output one of the test data from the input and the EC bits and the test data from the first circuit to the memory,
wherein the test data comprise T pairs of test vectors, wherein the T pairs of test vectors each include $2^{T-1}$ bits, wherein a first test vector of an $n^{th}$ pair of the T pairs of test vector includes $2^{n-1}$ bits that have a first state and that alternate every n bits, and wherein n is an integer from one to T.

13. The system of claim 12, wherein a second test vector of the $n^{th}$ pair of the T pairs of test vector includes $2^{n-1}$ bits that have a second state and that alternate every n bits.

14. The system of claim 12, further comprising:
an EC output circuit comprising an EC correction circuit, the EC correction circuit configured to correct errors in the test data read from one of the data portions based on the EC bits in the corresponding one of the EC portions.

15. The system of claim 14, wherein the EC output circuit further comprises an EC error detection circuit, the EC error detection circuit configured to generate that generates an error signal when a number of errors detected in the test data read from one of the data portions is greater than or equal to a predetermined threshold.

16. The system of claim 12, wherein the test data comprise test bits and test EC bits.

17. The system of claim 12, wherein the first circuit is configured to generate the EC bits using a code selected from the group consisting of error-correction codes and single-error correct, double-error detect codes.

18. An integrated circuit comprising the system of claim 12 and further comprising a built-in self-test circuit configured to generate the test data, wherein the switching device is configured to select one of the test data from the input and the EC and test data from the first circuit based on a test signal generated by the built-in self-test circuit.

19. An integrated circuit comprising the system of claim 12 and further comprising a generation circuit configured to output the test data to the input.

20. The system of claim 12 further comprising an EC error detection circuit configured to generate an error signal when a number of errors in the bits read from one of the data portions is greater than or equal to a predetermined threshold.

* * * * *